United States Patent
He et al.

(10) Patent No.: US 12,287,361 B2
(45) Date of Patent: Apr. 29, 2025

(54) POWER TRANSMISSION LINE MONITORING SYSTEM AND POWER TRANSMISSION LINE MONITORING METHOD

(71) Applicants: TSINGHUA UNIVERSITY, Beijing (CN); SICHUAN ENERGY INTERNET RESEARCH INSTITUTE, TSINGHUA UNIVERSITY, Chengdu (CN)

(72) Inventors: Jinliang He, Beijing (CN); Jun Hu, Beijing (CN); Yong Ouyang, Chengdu (CN); Yi Liu, Chengdu (CN); Shanxiang Wang, Beijing (CN); Rong Zeng, Beijing (CN); Zhanqing Yu, Beijing (CN)

(73) Assignees: TSINGHUA UNIVERSITY, Beijing (CN); SICHUAN ENERGY INTERNET RESEARCH INSTITUTE, TSINGHUA UNIVERSITY, Chengdu (CN)

( * ) Notice: Subject to any disclaimer, the term of this patent is extended or adjusted under 35 U.S.C. 154(b) by 139 days.

(21) Appl. No.: 18/308,109

(22) Filed: Apr. 27, 2023

(65) Prior Publication Data
US 2024/0361374 A1    Oct. 31, 2024

Related U.S. Application Data

(63) Continuation of application No. PCT/CN2021/116400, filed on Sep. 3, 2021.

(30) Foreign Application Priority Data

Sep. 11, 2020  (CN) .......................... 202010958162.1

(51) Int. Cl.
*G01R 31/08*    (2020.01)
*H04B 3/54*    (2006.01)
(Continued)

(52) U.S. Cl.
CPC ............. *G01R 31/085* (2013.01); *H04B 3/54* (2013.01); *G08C 17/02* (2013.01); *H04L 67/12* (2013.01);
(Continued)

(58) Field of Classification Search
CPC ........ G01R 31/085; H04B 3/54; G08C 17/02; H04L 67/12; H04Q 2209/40;
(Continued)

(56) References Cited

U.S. PATENT DOCUMENTS

2019/0349727 A1* 11/2019 Gundel .................... H04B 3/54
2020/0072814 A1*  3/2020 Bailey ................ G01M 5/0066
2021/0144568 A1*  5/2021 Takeuchi ............. H04W 24/08

FOREIGN PATENT DOCUMENTS

CN    104394571 A    3/2015
CN    105722144 A    6/2016
(Continued)

OTHER PUBLICATIONS

International Search Report issued in corresponding International application No. PCT/CN2021/116400, mailed Nov. 26, 2021.
(Continued)

*Primary Examiner* — Neel D Shah
*Assistant Examiner* — Adam S Clarke
(74) *Attorney, Agent, or Firm* — Daniel M. Cohn (57) ABSTRACT

Disclosed are a power transmission line monitoring system and a power transmission line monitoring method. The monitoring method comprises: acquiring, by means of a functional node, monitoring data related to a power transmission line, and transmitting the monitoring data to an edge
(Continued)

node; and receiving the monitoring data by means of the edge node, transmitting the monitoring data to a collection node by means of an edge node chain type communication network, and sending, by the collection node, the data to a master station server. In the application, a self-organized edge node chain type network is formed by means of edge nodes, and data transmission is performed by means of the edge node chain type network, so that problem of poor data transmission caused by impossible coverage of a cellular network can be solved.

18 Claims, 6 Drawing Sheets

(51) Int. Cl.
*G08C 17/02* (2006.01)
*H04L 67/12* (2022.01)
*H04Q 9/00* (2006.01)
*H04W 4/38* (2018.01)
*H04W 52/02* (2009.01)

(52) U.S. Cl.
CPC ........... *H04Q 9/00* (2013.01); *H04Q 2209/40* (2013.01); *H04Q 2209/43* (2013.01); *H04Q 2209/883* (2013.01); *H04W 4/38* (2018.02); *H04W 52/0209* (2013.01)

(58) Field of Classification Search
CPC ......... H04Q 2209/43; H04Q 2209/883; H04Q 9/00; H04W 4/38; H04W 52/0209; Y02D 30/70

See application file for complete search history.

(56) References Cited

FOREIGN PATENT DOCUMENTS

| CN | 105896730 A | * | 8/2016 | .......... H02J 13/0086 |
| --- | --- | --- | --- | --- |
| CN | 112104732 A | | 12/2020 | |
| WO | 2013148794 A1 | | 10/2013 | |

OTHER PUBLICATIONS

Written Opinion of the International Searching Authority for No. PCT/CN2021/116400, mailed Nov. 26, 2021.

* cited by examiner

POWER TRANSMISSION LINE MONITORING SYSTEM AND POWER TRANSMISSION LINE MONITORING METHOD

CROSS-REFERENCE

This specification claims priority to Chinese Application No. 202010958162.1, filled on Sep. 11, 2020, which is incorporated herein by reference in its entirety.

BACKGROUND OF THE INVENTION

1. Technical Field

The application relates to the technical field of management of power transmission lines, and particularly relates to a power transmission line monitoring system and a power transmission line monitoring method.

2. Description of Related Art

To ensure normal power supply of power transmission lines, the state of the power transmission lines, such as voltage, current, temperature and humidity, insulating properties, and natural disasters, often needs to be monitored.

With the development of technology, the remote monitoring technique is gradually used for monitoring power transmission lines. Specifically, field state data of power transmission lines is acquired by means of various data acquisition devices, and is then sent to a server to realize remote monitoring. However, in areas where network signals are poor or network coverage is impossible such as remote mountainous areas, the problems such impossible transmission or transmission errors of monitoring data occur commonly at present, which makes the monitoring effect unsatisfactory.

In view of this, it is of great significance for those skilled in the art to think out a more reliable power transmission line monitoring method to solve the above-mentioned problems.

BRIEF SUMMARY OF THE INVENTION

One embodiment of the application provides a power transmission line monitoring system. The power transmission line monitoring system comprises a functional node, an edge node and a collection node, wherein the functional node is used for acquiring at least one piece of monitoring data related to a power transmission line and transmitting the monitoring data to the edge node; at least two edge nodes on the power transmission line communicate with each other to form an edge node chain type communication network; the edge node is used for receiving the monitoring data acquired by the at least one functional node, and sequentially transmitting the monitoring data to the collection node by means of at least two edge nodes in the edge node chain type communication network; and the collection node is used for receiving data from at least one edge node and sending the data to a master station server.

One embodiment of the application provides a power transmission line monitoring method. The power transmission line monitoring method comprises: acquiring, by means of a functional node, at least one piece of monitoring data related to a power transmission line, and transmitting the monitoring data to an edge node; receiving, by means of the edge node, the monitoring data acquired by the at least one functional node, and sequentially transmitting the monitoring data to a collection node by means of at least two edge nodes in an edge node chain type communication network, wherein the edge node chain type communication network comprises at least two edge nodes, that communicate with each other, on the power transmission line; and receiving, by means of the collection node, data from at least one edge node, and sending the data to a master station server.

BRIEF DESCRIPTION OF THE SEVERAL VIEWS OF THE DRAWINGS

The application will be further described below with reference to illustrative embodiments, which are expounded in conjunction with accompanying drawings. These embodiments are not restrictive. In these embodiments, identical reference signs represent identical structures. Wherein.

DETAILED DESCRIPTION OF THE INVENTION

To more clearly explain the technical solutions of the embodiments of the application, drawings used for describing these embodiments will be briefly introduced below. Obviously, the drawings in the following description merely illustrate some examples or embodiments of the application, and those ordinarily skilled in the art can apply the application to other similar scenes according to these drawings without creative labor. Unless otherwise easily known from the context or additionally stated, identical reference signs represent identical structures or operations.

It should be understood that "system", "device", "unit" and/or "module" used in this specification are/is used for distinguishing different assemblies, elements, components, parts, portions, or assembly on different levels, and can be replaced with other expressions capable of realizing the same purpose.

"A", "one", "one type" and/or "said" used in the application and the claims do/does not refer in particular to the singular form, and may also refer to the plural form, unless otherwise expressly specified in the context. Generally speaking, terms "comprise" and "include" merely point out steps and elements that are clearly listed, and these steps and elements are not exclusive, so a method or device comprising these steps or elements may also comprise other steps or elements.

Flow diagrams are used in the application to describe operations executed by the embodiments of the application. It should be understood that the steps mentioned in this specification are not necessarily performed in strictly in order. These steps may also be performed in the inverted order or at the same time. Moreover, other operations can be added to these processes, or one or more operations can be removed from these processes.

In some embodiments, monitoring data related to a power transmission line can be sent to a master station server based on a cellular network to realize remote monitoring. However, in remote mountainous areas where complete coverage of the cellular network is impossible and network signals are unstable, the problems such as impossible transmission of monitoring data and transmission errors of the monitoring data during the transmission process occur frequently.

In view of these problems, the application provides a power transmission line monitoring system and a power transmission line monitoring method. A self-organized edge node chain type network is formed by means of a plurality of edge nodes, and data transmission is performed by means of the edge node chain type network, so that problems such as impossible transmission or transmission errors of monitoring data caused by impossible coverage of a cellular network or poor network signals in remote areas are solved.

The power transmission line monitoring system and the power transmission line monitoring method provided by the embodiments of the application will be described in detail below in conjunction with the accompanying drawings.

Figure 1:
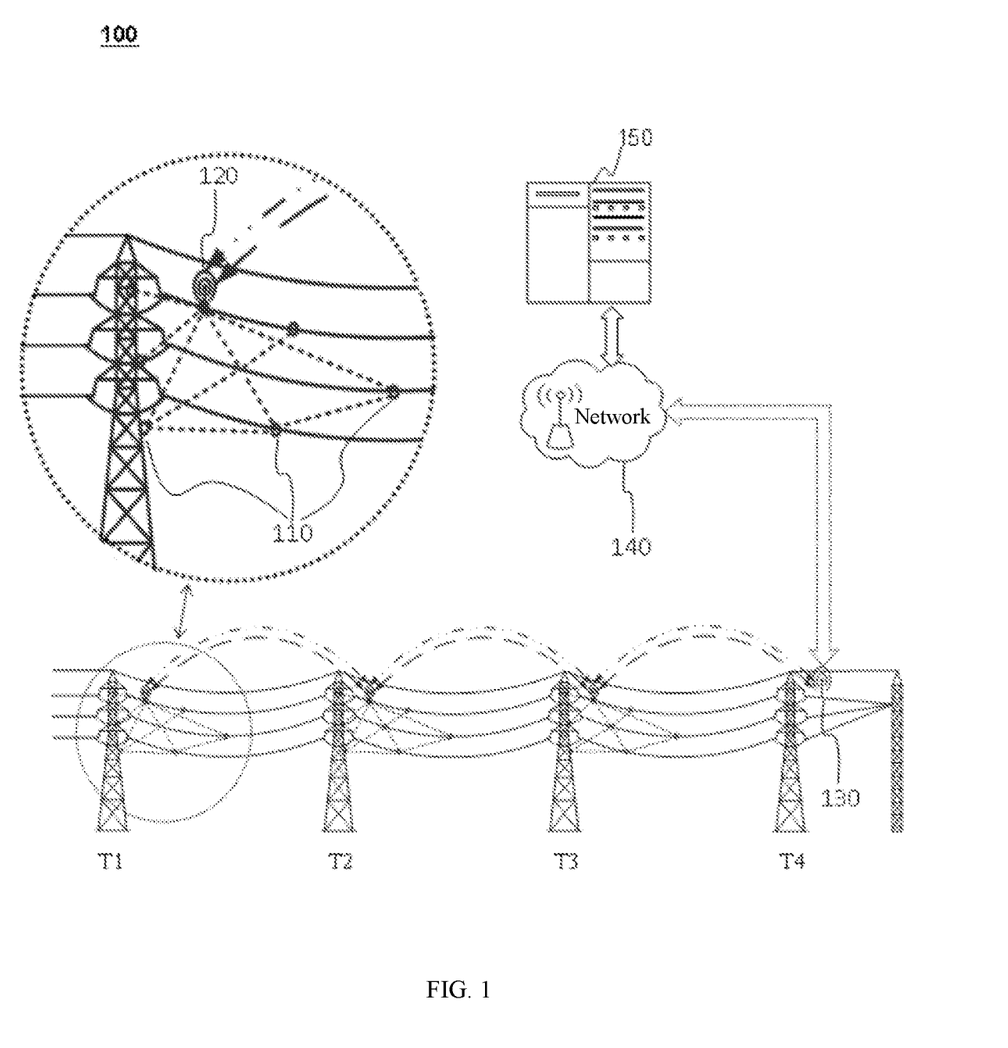
FIG. 1 is a schematic diagram of an application scenario of a power transmission line monitoring system according to some embodiments of the application.

FIG. 1 is a schematic diagram of an application scenario of a power transmission line monitoring system according to some embodiments of the application.

As shown in FIG. 1, in some embodiments, the power transmission line monitoring system 100 may comprise a functional node 110, an edge node 120, a collection node 130, a network 140, a master station server 150, and multiple power transmission sections obtained through partition by towers (T1, T2, T3 and T4).

Wherein, the functional node 110 may be used for acquiring monitoring data related to a power transmission line (such as voltage, current, temperature and humidity, parameters related to the insulating property of the power transmission line, and images or videos related to natural disasters), and transmitting the monitoring data to the edge node 120.

The edge node 120 may be used for receiving the monitoring data acquired by the at least one functional node 110, and then sending the monitoring data to other edge nodes 120 or the collection node 130.

Specifically, referring to FIG. 1, in some embodiments, one power transmission section may be formed between every two towers. At least one edge node 120 and multiple functional nodes 110 are disposed in each power transmission section, and the functional nodes 110 communicate with the edge node 120 in the same power transmission section. In addition, the edge nodes 120 in different power transmission sections communicate with each other, such that an edge node chain type communication network is formed by means of the edge nodes 120 in the power transmission line monitoring system, and the edge nodes 120 in the power transmission line monitoring system can send received monitoring data of the power transmission sections to the collection node 130 by means of the edge node chain type communication network.

Further, referring to FIG. 1, the collection node 130 may be connected to or communicate with the master station server through the network 140. The collection node 130 may be used for receiving and processing data sent by at least one edge node 120, and then sending the processed data to the master station server 150 through the network 140, such that the master station server 150 can obtain the current state of the power transmission line based on received data, and the state of the power transmission line is monitored.

Wherein, the network 140 may comprise any network that can promote information and/or data exchange between the collection node 130 and the master station server 150. For example, the network 140 may be or comprise a public network (such as the Internet), a private network (such as a local area network (LAN)), a wired network, a wireless network (such as a 802.11 network or a Wi-Fi network), a frame relay network, a virtual private network (VPN), a satellite network, a telephone network, a router, a hub, a switch, a server computer and/or any combination thereof. In some embodiments, the network 140 may also comprise at least one network access point such as a base station and/or Internet exchange point, and the collection node 130 and/or the master station server 150 may be connected to the network 140 through the access point to exchange data and/or information.

In some embodiments, at least one of the functional node 110, the edge node 120 and the collection node 130 may comprise a power acquisition device, and any one or more of the functional node 110, the edge node 120 and the collection node 130 may be electrically connected (in a contact manner or a non-contact manner) to a power transmission cable in the power transmission line through the power acquisition device to acquire power from the power transmission cable.

Specifically, in some embodiments, the power acquisition device many be a current transformer (CT) power acquisition module, and any one or more of the functional node 110, the edge node 120 and the collection node 130 may be connected to the power transmission cable in a non-contact manner through the CT power acquisition module to perform current transformation, so as to generate induction current to be supplied with power.

Figure 2:
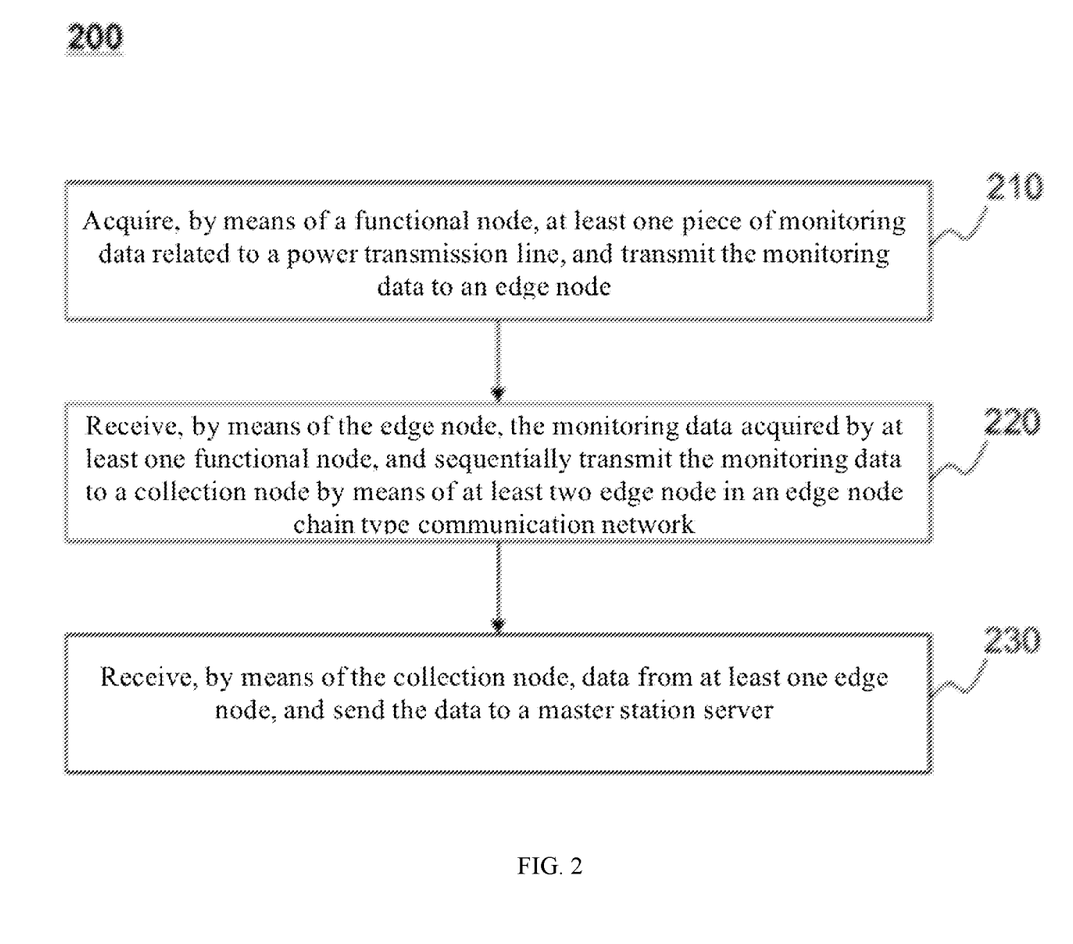
FIG. 2 is an illustrative flow diagram of a power transmission line monitoring method according to some embodiments of the application.

FIG. 2 is an illustrative flow diagram of the power transmission line monitoring method according to some embodiments of the application. The power transmission line monitoring method 200 may be applied to the power transmission line monitoring system 100 shown in FIG. 1. As shown in FIG. 2, the power transmission line monitoring method may comprise:

Step 210, acquiring, by means of a functional node, at least one piece of monitoring data related to a power transmission line, and transmitting the monitoring data to an edge node.

In some embodiments, one or more functional nodes may be disposed in each power transmission section of the power transmission line monitoring system 100 to be respectively used for acquiring different monitoring data related to the power transmission line in the corresponding power transmission section, and then the acquired monitoring data is transmitted to the edge node disposed in the corresponding power transmission section.

Specifically, in some embodiments, the functional node may comprise a support seat, and a sensor and a third communication module disposed on the support seat. Wherein, the support seat may be used for mounting the functional node on a tower or a power transmission cable of the power transmission line, the sensor may be used for acquiring monitoring data related to the power transmission line, and the third communication module may be used for transmitting the acquired monitoring data to the edge node. In some embodiments, the support seat may be made of an insulative material.

Further, in some embodiments, the sensor may comprise a voltage sensor, a current sensor, a resistance sensor, a temperature sensor, a humidity sensor, an image sensor, and the like. In some embodiments, different functional nodes may be provided with identical or different sensors to acquire desired data. For example, in some embodiments, three voltage sensors may be disposed on a first support seat, a second support seat and a third support seat respectively to form a first functional node, a second functional node and a third functional node for acquiring the voltage of three phase lines in the power transmission line respectively. For another example, in some other embodiments, an image sensor may be disposed on a fourth support seat to form a fourth functional node used for acquiring field images or videos of the corresponding power transmission section, and a temperature sensor may be disposed on a fifth support seat to form a fifth functional node used for acquiring temperature data of the power transmission cable. Those skilled in the art should understand that functional nodes used for acquiring other related data can be obtained in this way, which will not be detailed here.

In some embodiments, the third communication module may be a wireless communication module, such as a Bluetooth module, a ZigBee module, a Near Field Communication (NFC) module, or an Ultra WideBand module (UWB) module. Each function module may comprise one or more of the Bluetooth module, the ZigBee module, the NFC module and the UWB module.

In some embodiments, considering that the monitoring data acquired by functional node nearby cannot be received in time when the edge node breaks down, in some embodiments, all available edge nodes within a preset communication range (such as 100 m) are detected by means of the functional node before the functional node sends data to the edge node; then, a target edge node is determined according to the current state of the available edge nodes and the distance between edge nodes and the current functional node; and finally, a communication connection is established between the current functional node and the target edge node, and monitoring data acquired by the current functional node is sent to the target edge node. It should be noted that the current state of the available edge nodes may be whether the edge nodes are available, whether communication is congested, and whether the communication rate meets requirements, and the distance between the edge nodes and the current functional node may be reflected by the signal intensity between the edge nodes and the current functional node. In some embodiments, an optimal edge node (the target edge node mentioned above) is selected from multiple edge nodes through the above method to be used for data transmission, so the communication reliability between the functional node and the edge node and real-time data feedback are further guaranteed.

Referring to FIG. 2, after Step 210, the power transmission line monitoring method further comprises:

Step 220, receiving, by means of the edge node, the monitoring data acquired by the at least one functional node, and sequentially transmitting the monitoring data to a collection node through at least two edge nodes in an edge node chain type communication network.

In some embodiments, the edge node may comprise a fourth communication module matched with the third communication module of the functional node, and the edge node can receive monitoring data acquired by one or more functional nodes in the corresponding power transmission section through the fourth communication module.

It should be noted that in some embodiments, when the edge node closest to the functional node breaks down, the functional node can communicate with the second closest edge node and send acquired monitoring data to the second closest edge node, thus ensuring that the monitoring data acquired by the functional node can be fed back successfully.

Further, after receiving the monitoring data sent by the functional node, the edge node can sequentially transmit the received monitoring data to the collection node by means of the edge node chain type communication network formed by means of the edge nodes.

Similarly, in some embodiments, when the edge node closest to the current edge node breaks down, the current edge node may communicate with the second closest edge node, thus ensuring normal use of the edge node chain type communication network. It should be noted that, in some embodiments, an optimal edge node may be selected from multiple available edge node through the same method as the functional node, and communicate with the current edge node to form the edge node chain type communication network, thus ensuring the reliability of the edge node chain type communication network and real-time data transmission.

Figure 3:
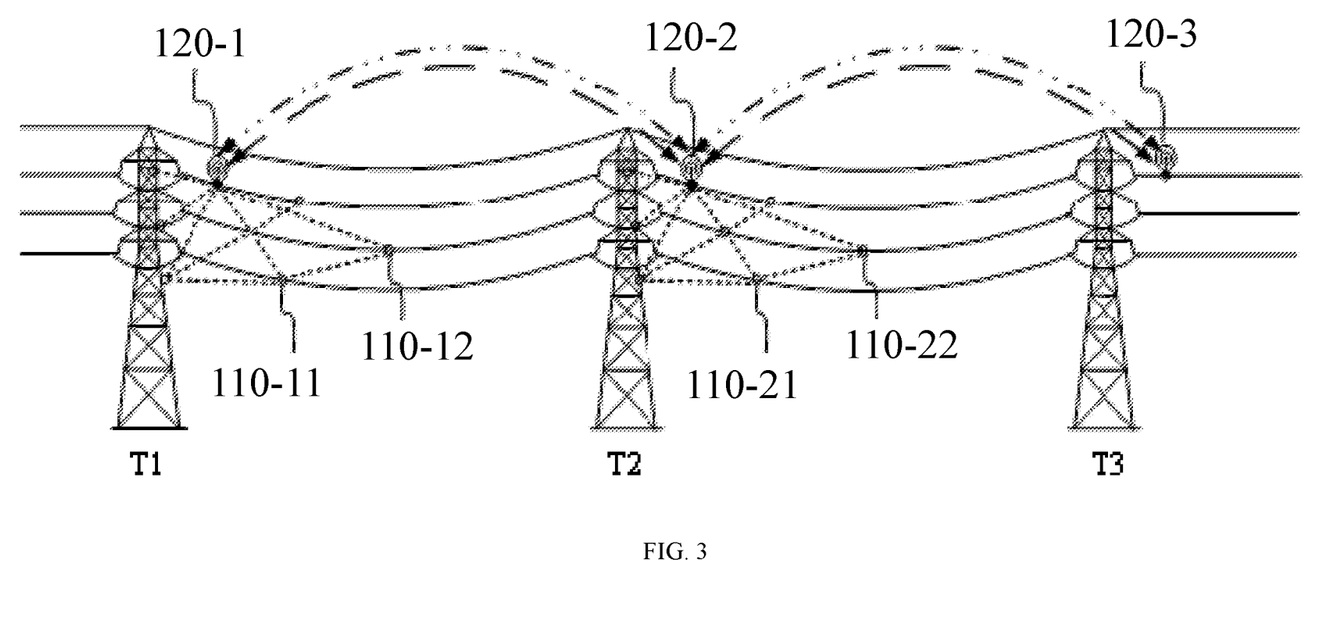
FIG. 3 is a schematic diagrams of an edge node chain type communication network according to some embodiments of the application.
Figure 4:
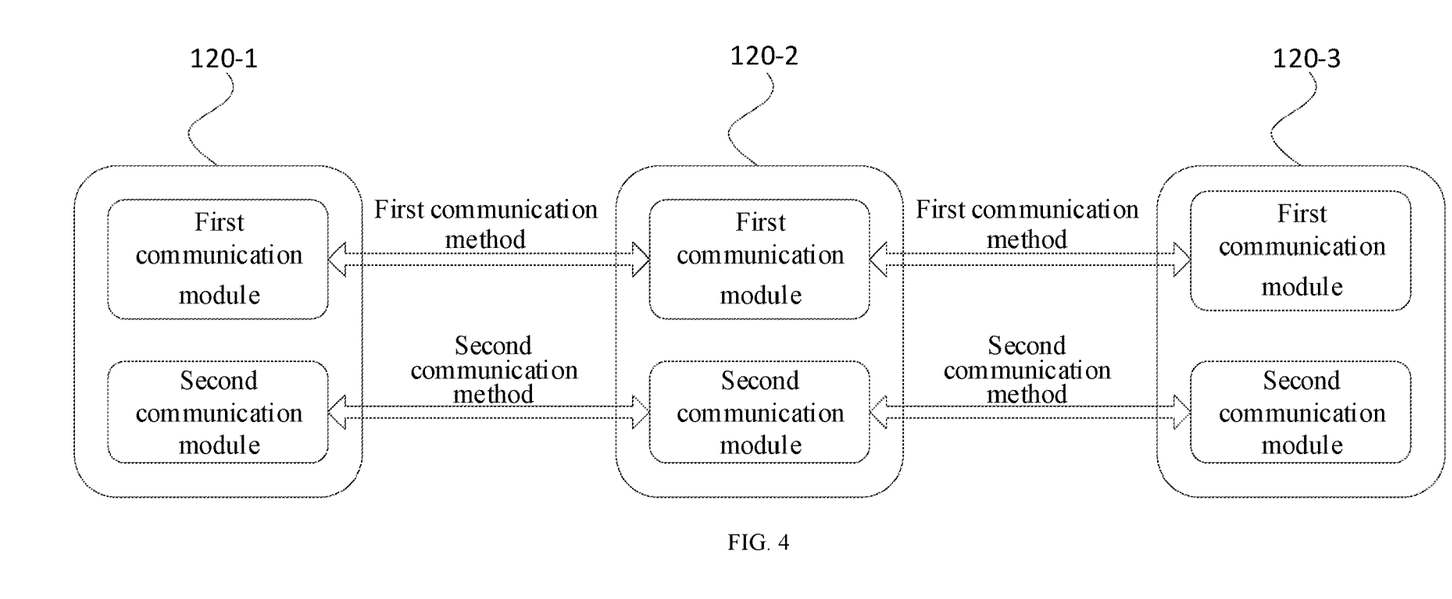
FIG. 4 is a schematic diagrams of an edge node chain type communication network according to some embodiments of the application.

FIG. 3 and FIG. 4 are schematic diagrams of the edge node chain type communication network according to some embodiments of the application.

Referring to FIG. 3, in some embodiments, edge nodes disposed in two adjacent power transmission sections communicate with each other, such that an edge node chain type network is formed by means of the edge nodes disposed in different power transmission sections; and data can be transmitted stage by stage through the edge node chain type network.

For example, in some embodiments, a first edge node 120-1 disposed near a tower T1 communicates with a second edge node 120-2 disposed near an adjacent tower T2, then the second edge 120-2 communicates with a third edge node 120-3 disposed near an adjacent tower T3, . . . , such that edge nodes in any two adjacent power transmission sections keep communicating with each other to form a self-organized edge node chain type network. The first functional node 110-11, the second functional node 110-12 and other more functional nodes disposed in a first power transmission section (such as the area near the tower T1 or the area between the tower T1 and the tower T2) send acquired monitoring data to the first edge node 120-1 disposed in this power transmission section, and then the first edge node 120-1 sequentially transmits the received data to the second edge node 120-2, the third edge node 120-3, . . . , and the final edge node in the edge node chain type network by means of the edge node chain type network, and then, the final edge node sends the data to the collection node.

Referring to FIG. 4, in some embodiments, the edge node chain type communication network may comprise two communication channels, wherein one communication channel may be formed by a first communication module with a high data transmission rate (or a high transmission frequency) and is used for transmitting a first type of data with a relative large data size (the data size refers to the data size of a single piece of data) (such as image data or video data acquired by an image sensor) through a first communication method, such that the transmission rate of the monitoring data is ensured, and the situation where the real-time performance is compromised due to an excessively large monitoring data transmission delay is avoided; and the other communication channel may be formed by a second communication module with a relative small data transmission rate (or a low transmission frequency), and is used for transmitting a second type of data with a relative small data size (such as voltage data acquired by a voltage sensor, current data acquired by a current sensor, temperature data acquired by a temperature sensor, request instructions, or control instructions).

In other words, in some embodiments, each edge node may comprise a first communication module and a second communication module. Two edge nodes disposed in different power transmission sections may form a first communication channel through the first communication module to implement a first communication method to transmit a first type of data with a relatively large data size, such as image data or video data acquired by the functional node. Similarly, two edge nodes in different power transmission sections may form a second communication channel through the second communication module to implement a second communication method to transmit a second type of data with a relatively small data size, such as voltage, current, resistance, temperature and humidity acquired by the functional node.

Specifically, in some embodiments, the first communication module may comprise a WiFi module, and the second communication module may comprise any one of a LoRa module, a ZigBee module, or a Bluetooth module.

It should be understood that the above communication modules are merely illustrative, and in the application, the first communication module may comprise, but is not limited to, the WiFi module, and the second communication module may comprise, but is not limited to, the LoRa module, the Zigbee module, or the Bluetooth module.

Further, in some embodiments, considering that power consumption of the first communication module is higher than that of the second communication module, in some embodiments, the first communication module may be turned off by default, only the second communication module is used for transmitting common data (such as control instructions, voltage, temperature, and other byte information), and the first communication module is turned on when the second communication module receives a request for implementing the first communication method sent by other edge nodes or a first type of data needs to be transmitted to other edge nodes, such that power consumption of the edge nodes is reduced to some extent.

In addition, in some embodiments, after the first type of data is transmitted through the first communication module, the first communication module is turned off instantly and is kept off, so power consumption of the edge nodes is further reduced.

Figure 5:
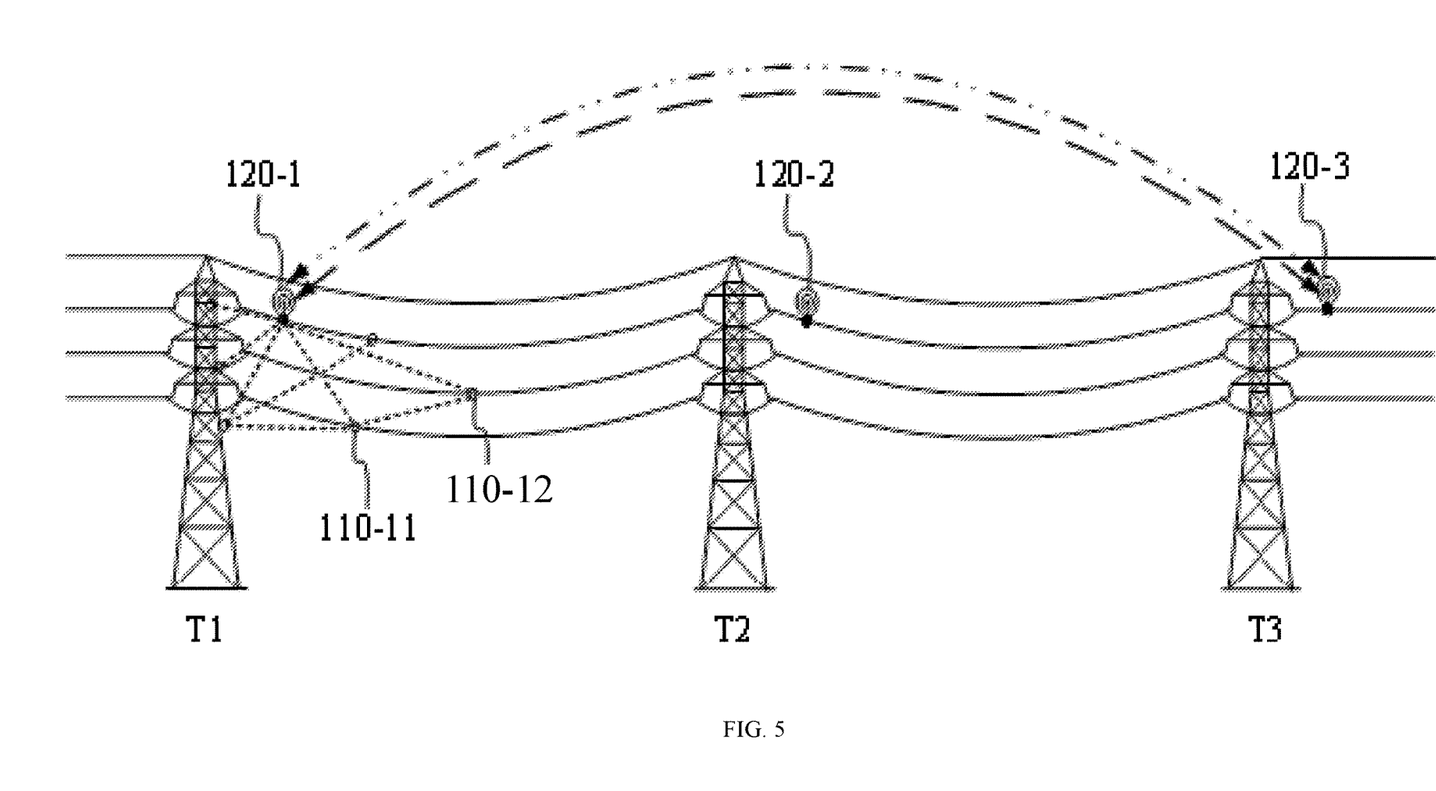
FIG. 5 is a schematic diagrams of an edge node chain type communication network according to some other embodiments of the application.
Figure 6:
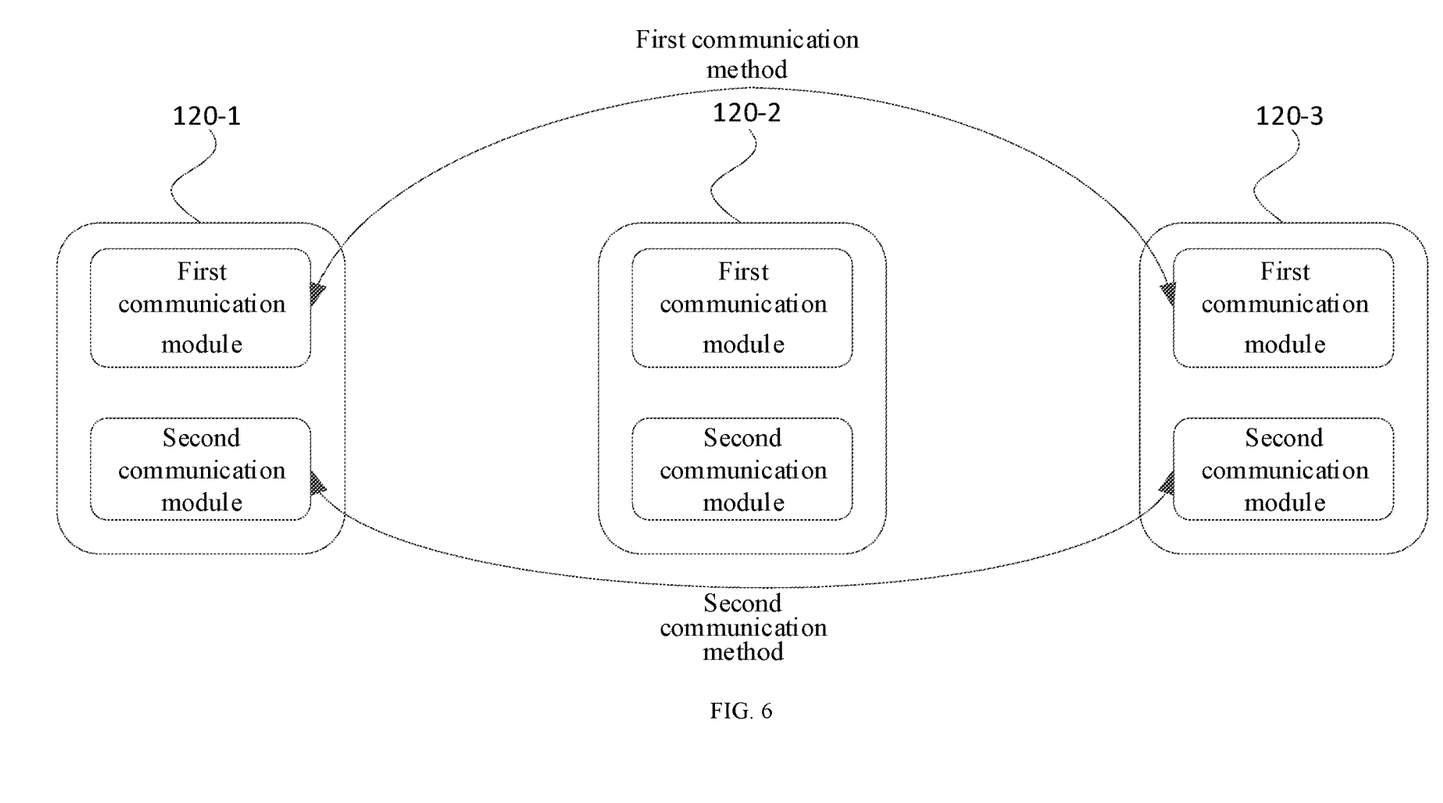
FIG. 6 is a schematic diagrams of an edge node chain type communication network according to some other embodiments of the application.

FIG. 5 and FIG. 6 are schematic diagrams of the edge node chain type communication network according to some other embodiments of the application.

Referring to FIG. 5, in some embodiments, two or more other edge nodes may be disposed within the communication range of one edge node. For example, a second edge node 120-2 located in an adjacent power transmission section, and a third edge node 120-3 located in a non-adjacent power transmission section may be disposed within the communication range of a first edge node 120-1, and the first edge node 120-1 may communicate with the second edge node 120-2 or communicate with the third edge node 120-3 to transmit data. In this way, when the second edge node 120-2 breaks down, data received by the first edge node 120-1 may skip the second edge node 120-2 to be directly transmitted to the third edge node 120-3, thus ensuring that data can still be transmitted by means of the edge node chain type network under the condition that part of the edge nodes in the edge node chain type network break down.

Referring to FIG. 6, when the first edge node 120-1 skips the second edge node 120-2 in the adjacent power transmission section to directly communicate with the third edge node 120-3 in the non-adjacent power transmission section, the first communication method is implemented through the first communication module to transmit the first type of data, and the second communication method is implemented through the second communication method to transmit the second type of data. More details of the first communication method and the second communication method can be found in other parts of the application (such as the relevant description of FIG. 3 and FIG. 4), and will not be detailed here.

In some embodiments, the edge node may also be used for receiving and processing data from the functional node or other edge nodes, and then feeding a processing result to the functional node, other edge nodes or the collection node. For example, in some embodiments, the edge node may receive monitoring data sent by the functional node, and preliminarily summarize or encrypt the monitoring data, and then send the processed data to other edge nodes, such that the data can be sent to the collection node by means of the edge node chain type network. It should be understood that when the last edge node in the edge node chain type network is used as for processing data, data capable of being processed by the last edge node may comprise data sent by other edge nodes in the chain type network and data sent by the functional node nearby, and the processed data can be directly fed back to the collection node.

For another example, a current edge node receives and processes data from the functional node or other edge nodes, and sends a control instruction to the corresponding functional node or other edge nodes based on a processing result. At this moment, a local area network is formed by the current edge node, and the functional node and other edge nodes communicating with the current edge node, and the current edge node, as the control center of the network, directly processes information acquired by all the nodes in the network and directly issues a corresponding control instruction (such as an instruction for supplementing the light around the image sensor to acquire a clearer image, or an instruction for adjusting the data acquisition frequency of a voltage sensor).

For another example, in some embodiments, each functional node and each edge node may correspond to an identity (such as an MAC address); and before receiving data sent by the functional node or other edge nodes, the edge node may perform identity authentication according to the identity included in a communication request sent by the functional node or other edge nodes, and then feeds an authentication result to the functional node or other edge nodes sending the communication result according to the authentication result. Specifically, in some embodiments, the edge node determines whether the functional node or other edge nodes sending a communication request meet a preset communication condition according to an identity acquired from the communication request; if the functional node or other edge nodes meet the preset communication condition, data sent by the functional node or other edge nodes is received; otherwise, data sent by the functional node or other edge nodes is rejected. Optionally, in some embodiments, the process of determining whether the functional node or other edge nodes meet the preset communication condition may comprise: determining whether the identity of a request sender (such as the functional node and other edge nodes mentioned above) has been registered in the master statin server; if so, determining that the request sender meets the preset communication condition; if not, determining that the request sender does not meet the preset communication condition. In some embodiments, a registered node (the functional node or other edge nodes) identity is saved in each edge node.

For another example, in some embodiments, the monitoring system may further comprise a control terminal, which is used by an operator near one power transmission section and may be a tablet personal computer, a laptop computer, a mobile phone, a personal digital assistant (PAD), or the like, and the control terminal may be accessed to one edge node through a wireless network (such as WiFi) and accessed to the edge node chain type network through the edge node. A control instruction sent by the control terminal may be transmitted to a corresponding target edge node by means of the edge node chain type network; when receiving the control instruction, the target edge node analyzes the control instruction and then sends the analyzed control instruction to the corresponding functional node to control the corresponding functional node (such as setting the data acquisition frequency or adjusting the image acquisition view angle).

Further, in some embodiments, the edge node may further comprise a remote wireless communication module such as a 3G/4G/5G communication module. At least one edge node in the power transmission line monitoring system may directly communicate with the collection node or the master station server through the remote wireless communication module, such that when monitoring data is transmitted to a power transmission section covered with a remote wireless communication network (such as a cellular network) by means of the edge node chain type network, the data can be directly transmitted to the collection node or the master station server through the remote wireless communication module configured in the edge node in this power transmission section. In this way, stage-by-stage data transmission is avoided by means of the edge node chain type network, thus shortening the transmission time of the monitoring data, reducing the transmission delay of the monitoring data, and improving the real-time performance of the monitoring data.

Referring to FIG. 2, after Step 220, the power transmission line monitoring method further comprises:

Step 230: receiving, by means of the collection node, data from at least one edge node, and sending the data to the master station server.

In some embodiments, the collection node may be disposed in an area with good network resources such as a transformer substation, and is used for receiving and processing, such as summarizing, data sent by other edge nodes through the edge node chain type network, and then sending the summarized data to the master station server. In some embodiments, the collection node may be the last edge node in the transmission path of the edge node chain type network.

In some embodiments, the master station server may process received monitoring data based on the artificial intelligence technique to realize natural disaster (such as rain, snow, icing, or lightning) sensing, power transmission line fault recognition, power transmission line state evaluation, and risk pre-warning.

Further, in some embodiments, monitoring data sent to the edge node by the functional node may comprise acquisition object information and/or positional information corresponding to the functional node, and after receiving the monitoring data, the master station server may process the acquisition object information and/or positional information in the monitoring data to obtain the current power transmission state of a corresponding object or position.

The embodiments of the application have, but are not limited to, the following beneficial effects: (1) a self-organized edge node chain type network is formed by means of edge nodes, and data transmission is performed by means of the edge node chain type network, so that problems such as impossible transmission or transmission errors of monitoring data caused by impossible coverage of a cellular network or poor network signals in remote areas can be solved; (2) a first type of data and a second type of data are transmitted through a first communication method and a second communication method respectively, and the first communication method is disabled by default, such that power consumption of the edge nodes is minimized under the condition that the transmission rate of monitoring data is ensured; (3) a power acquisition module is configured for the functional node, the edge node and the collection node, such that the functional node, the edge node and the collection node can acquire power automatically, thus reducing labor consumption for later maintenance; (4) a wireless communication module is configured for the edge node, and when monitoring data is transmitted to a power transmission section covered with a remote wireless communication network by means of the edge node chain type network, the data can be directly transmitted to the collection node or the master station server through the remote wireless communication module, so stage-by-stage data transmission is avoided by means of the edge node chain type network, thus shortening the transmission time of the monitoring data, reducing the transmission delay of the monitoring data, and improving the real-time performance of the monitoring data.

It should be noted that different embodiments may fulfill different beneficial effects, and in different embodiments, any one or more of the above beneficial effects, or other possible beneficial effects can be fulfilled.

It should be understood that the power transmission line monitoring system and the power transmission line monitoring method can be implemented in various ways. For example, in some embodiments, the monitoring system and modules thereof may be implemented through hardware, software, or the combination of hardware and software. Wherein, the hardware part may be realized by means of special logic, and the software part may be stored in a memory and executed by a suitable instruction execution system such as an MCU or specially designed hardware. Those skilled in the art can understand that the method and system may be implemented through computer-executable instructions and/or control codes in a processor, such as carrier media in disks, CDs or DVD-ROMs, and codes provided by programmable memories of ROMs or data carriers such as optical or electronic signal carriers. The system and modules thereof can be implemented through a super-large-scale integrated circuit or gate array, semiconductors such as logic chips and transistors, or a hardware circuit of programmable hardware equipment such as a field-programmable gate array and programmable logic equipment, and can also be implemented through software executed by, such as, various processors, or through the combination of the hardware circuit and the software (such as firmware).

It should be noted that the above description of the system and method is merely illustrative and explanatory, and is not intended to limit the scope of the application. Those skilled in the art can make various amendments and transformations to the system and method with guidance of this application. All these amendments and transformations also fall within the scope of the application.

Moreover, specific terms used for describing the embodiments of the application, such as "an embodiment", "one embodiment", and/or "some embodiments", refer to a certain feature, structure or characteristic related to at least one embodiment of the application. So, it should be emphasized and noted that "an embodiment", "one embodiment", and/or "some embodiments" mentioned twice or more times at different positions of this specification do not refer to the same embodiment. In addition, some features, structures or characteristics in one or more embodiments of the application can be combined properly.

In addition, those skilled in the art should understand that all aspects of the application may be explained and described with a plurality of patentable types and or cases, including the combination of any novel and useful processes, machines, products or substances, or any novel and useable improvements thereof. Correspondingly, all the aspects of the application can be executed completely through hardware, completely through software (including firmware, permanent software, and micro-codes), or through the combination of hardware and software. The hardware or software may be referred to as "data block", "module", "engine", "unit", "module" or "system". In addition, all the aspects of the application may be reflected as a computer product located in one or more computer-readable medium, such as a computer-readable program code.

Furthermore, unless expressly stated in the claims, the order of elements and steps, the use of numbers and alphabets, or the use of other names do not aim to limit the sequence of the process and method of the application. Although some embodiments of the invention, which are considered as useable currently, are discussed in the above disclosure, it should be understood that these details are merely for a descriptive purpose, and the appended claims are not limited to the embodiments disclosed above. The claims aim to cover all amended and equivalent combinations conforming to the essence and scope of the embodiments of the application. For example, although the system modules are implemented through hardware in the above description, they can also be implemented through software, for example, the system may be installed in existing servers or mobile devices.

Similarly, it should be noted that for the sake of a brief description of the application to facilitate the understanding of one or more embodiments of the invention, multiple features may be gathered in one embodiment, drawing or description of the application. However, this does not mean that the features needed by the subject matter of the application are more than the features mentioned in the claims. Actually, the features in the embodiments should be less than all the features disclosed in one embodiment.

Each patent, patent application, patent application disclosure and other documents such as articles, books, descriptions, prints, and documents cited in this application are incorporated herein by reference in its entirety, and historical application documents inconsistent with or conflicting with the contents of the application and documents limiting the broadest scope of the claims of the application (attached to the application here or after) are excluded. It should be pointed out that in case where the description, definition and/or use of terms in the appended documents is inconsistent with or conflicts with the contents of the application, the description, definition and/or use of terms should prevail.

Finally, it should be understood that the embodiments in this specification are merely used to explain the principle of the embodiments of the application. Other transformations may also fall within the scope of the application. Thus, these embodiments are illustrative rather than restrictive, and alternate configurations of the embodiments of the application may be consistent with the concept of the application. Correspondingly, the embodiments of the application are not limited to those clearly introduced and described here.

What is claimed is:

1. A power transmission line monitoring system, comprising a functional node, an edge node and a collection node, wherein:
    the functional node is used for acquiring at least one piece of monitoring data related to a power transmission line, and transmitting the monitoring data to the edge node;
    at least two edge nodes on the power transmission line communicate with each other to form an edge node chain type communication network, wherein the edge node chain type communication network comprises two communication channels, one of the two communication channels is formed by a first communication module with a first data transmission rate and is used for transmitting a first type of data with a first data size; and the other one of the two communication channels is formed by a second communication module with a second data transmission rate, and is used for transmitting a second type of data with a second data size, the first data transmission rate is larger than the second data transmission rate; wherein the edge node is used for receiving the monitoring data acquired by at least one said functional node, and sequentially transmitting the monitoring data to the collection node by means of at least two edge nodes in the edge node chain type communication network;
    the collection node is used for receiving data from at least one edge node, and sending the data to a master station server.

2. The power transmission line monitoring system according to claim 1, wherein the edge node is also used for transmitting the first type of data to other edge nodes through a first communication method, and transmitting the second type of data to other edge nodes through a second communication method.

3. The power transmission line monitoring system according to claim 2, wherein the edge node comprises the first communication module and the second communication module;
    the first communication module is used for implementing the first communication method, and the second communication module is used for implementing the second communication method.

4. The power transmission line monitoring system according to claim 3, wherein the first communication module comprises a WiFi module, and the second communication module comprises a LoRa module, a ZigBee module or a Bluetooth module.

5. The power transmission line monitoring system according to claim 2, wherein the first data size of the first type of data is greater than the second data size of the second type of data; the first type of data comprises images, and the second type of data comprises state parameters; and a transmission rate and power consumption of the first communication method are greater than those of the second communication method.

6. The power transmission line monitoring system according to claim 1, wherein the edge module is also used for receiving and processing data from at least one said functional node or other edge nodes, and feeding a processing result back to the at least one functional node, the other edge nodes or the collection node.

7. The power transmission line monitoring system according to claim 1, wherein the functional node comprises a support seat, the support seat is at least provided with a sensor and a third communication module, and the functional node is mounted on a tower or a power transmission cable of the power transmission line through the support seat.

8. The power transmission line monitoring system according to claim 7, wherein the third communication module is a wireless communication module, and comprises any one or more of a Bluetooth module, a Zigbee module, an NFC module and a UWB module.

9. The power transmission line monitoring system according to claim 1, wherein the collection node is used for sending data from at least one edge node to the master station server by internet.

10. The power transmission line monitoring system according to claim 1, wherein one or more of the functional node, the edge node and the collection node further comprises a power acquisition device;
the power acquisition device is electrically connected to a power transmission cable in the power transmission line to supply power to one or more of the functional node, the edge node and the collection node.

11. A power transmission line monitoring method, comprising:
acquiring, by means of a functional node, at least one piece of monitoring data related to a power transmission line, and transmitting the monitoring data to an edge node;
receiving, by means of the edge node, the monitoring data acquired by at least one said functional node, and sequentially transmitting the monitoring data to a collection node by means of at least two edge nodes in an edge node chain type communication network, wherein the edge node chain type communication network comprises two communication channels, one of the two communication channels is formed by a first communication module with a first data transmission rate and is used for transmitting a first type of data with a first data size; and the other one of the two communication channels is formed by a second communication module with a second data transmission rate, and is used for transmitting a second type of data with a second data size, the first data transmission rate is larger than the second data transmission rate; wherein the edge node chain type communication network comprises at least two edge nodes, that communicate with each other, on the power transmission line; and
receiving, by means of the collection node, data from at least one edge node, and sending the data to a master station server.

12. The power transmission line monitoring method according to claim 11, wherein the step of acquiring, by means of a functional node, at least one piece of monitoring data related to a power transmission line and transmitting the monitoring data to an edge node comprises:
detecting, by means of the functional node, available edge nodes within a preset communication range;
determining a target edge node according to a current state of the available edge nodes and a distance between each of the available edge nodes and a current functional node; and
establishing a communication between the current functional node and the target edge node.

13. The power transmission line monitoring method according to claim 12, wherein for any one of the at least two edge nodes that communicate with each other,
keeping the first communication module for implementing the first communication method off, and keeping communication with other edge nodes through the second communication method;
when a first communication request sent by other edge nodes through the second communication method is received, turning on the first communication module, and transmitting the first type of data to other edge nodes through the first communication method;
or, when the first type of data needs to be transmitted to other edge nodes, turning on the first communication module, and sending a first communication request to other edge nodes through the second communication method.

14. The power transmission line monitoring method according to claim 11, further comprising: for any one of the at least two edge nodes that communicate with each other,
transmitting the first type of data to other edge nodes through a first communication method, and transmitting the second type of data to other edge nodes through a second communication method.

15. The power transmission line monitoring method according to claim 14, wherein the first data size of the first type of data is greater than the second data size of the second type of data; the first type of data comprises images, and the second type of data comprises state parameters;
and a transmission rate and power consumption of the first communication method are greater than those of the second communication method.

16. The power transmission line monitoring method according to claim 11, further comprising:
receiving data from at least one said functional node or other edge nodes by means of the edge nodes;
processing the data; and
feeding a processing result to the at least one functional node, the other edge nodes or the collection node.

17. The power transmission line monitoring method according to claim 11, further comprising:
acquiring power from the power transmission line by means of a power acquisition device, such that the power is used by one or more of the functional node, the edge node and the collection node.

18. The power transmission line monitoring method according to claim 11, further comprising:
obtaining, by means of the edge node, an identity of the functional node or other edge nodes;
determining, according to the identity, whether the functional node or the other edge nodes meet a preset communication condition; and
if the functional node or the other edge nodes meet the preset communication condition, receiving data sent by the functional node or the other edge nodes; otherwise, rejecting data sent by the functional node or the other edge nodes.

* * * * *